INJECTION-LUMINESCENT G A DIODES HAVING A GRADED P-N JUNCTION

Filed Nov. 24, 1965

INVENTOR
ARNO H. HERZOG
BY William J. Andrews
ATTORNEY

United States Patent Office 3,419,742
Patented Dec. 31, 1968

3,419,742
INJECTION-LUMINESCENT GaAs DIODES HAVING A GRADED P-N JUNCTION
Arno H. Herzog, St. Louis, Mo., assignor to Monsanto Company, St. Louis, Mo., a corporation of Delaware
Filed Nov. 24, 1965, Ser. No. 509,598
2 Claims. (Cl. 313—108)

ABSTRACT OF THE DISCLOSURE

Injection-luminescent GaAs diodes are formed by a diffusion process whereby a substantially linear graded p-n junction is formed between an n-type conductivity region doped to a carrier concentration of from $10^{16}$ to $5\times10^{18}$ atoms/cc. of an n-type dopant and a p-type radiative recombination region having a surface carrier concentration of about $4\times10^{19}$ atoms/cc. of zinc. Alternatively, the diffusion process may be controlled to produce a radiative recombination p-type region having a lower p-n junction and an upper $p^+$-p junction having a zinc concentration of about $4\times10^{19}$ atoms/cc. above which there is $p^+$-type conductivity region having a surface zinc impurity concentration of about $10^{20}$ atoms/cc.

The present invention relates to injection-luminescent gallium arsenide, GaAs, diodes having high external quantum efficiencies.

One aspect of this invention pertains to semiconductor components as articles of manufacture comprising single crystal GaAs having a region of n-type conductivity doped to a carrier concentration of from $10^{16}$ to $5\times10^{18}$ atoms/cc. of n-type impurity donor atoms ($N_D$), a graded p-n junction merging with a radiative recombination band or layer which extends into a region of p-type conductivity GaAs to a distance of from 5 to about 25 microns and which is doped with zinc to a carrier concentration of about $4\times10^{19}$ atoms/cc. at the distal edge from said p-n junction.

Another aspect of this invention pertains to injection-luminescent gallium arsenide diode devices which utilize the above-described semiconductor components to produce exceptionally high external quantum efficiencies.

Still another aspect of this invention pertains to a vapor diffusion process wherein zinc is diffused into a body of n-type GaAs in a controlled manner to provide the novel, highly efficient injection-luminescent components and diodes of this invention.

The utility of injection-luminescent diodes in conjunction with photon-coupled devices such as photodetectors, phototransistors, oscillators, modulators, multiplexers, signal generators, photoconductors for relays, switches, electrical and optical amplifiers and the like has given rise to extensive research efforts to produce diodes having maximum external quantum efficiencies. These research efforts have resulted in the commercial production of injection-luminescent GaAs diodes having external quantum efficiencies of from 0.1% to 0.3% (see Electronics, July 27, 1964, p. 59), which are typical of efficiencies presently found in GaAs injection-luminescent diodes.

Various materials and procedures have been described or suggested for obtaining efficient electroluminescent diodes using semiconductor materials. For example, SiC diodes having p- and n-type regions separated by a highly resistive interlayer, i.e. p-i-n junctions, were found by Lassev in 1923 to emit light when a forward bias was applied. Lehovec et al. in the early fifties explained light emission in SiC crystals in terms of p-n injection and radiative recombination in forward-biased p-n junctions. Patrick, Rucker and Fischer independently concluded that the junctions were not p-n, but $n^*$-n-$p^*$ junctions with a highly resistive n-layer between highly conducting $n^*$ and $p^*$-layers. More recently, forward p-n injection luminescence has been found in germanium, silicon, and III–V compounds by various workers. Keyes et al. (Proc. Insti. Radio Engrs., 50 1922 (1962)) have described diodes fabricated from single crystal n-type gallium arsenide wherein a p-type layer was formed by diffusion with zinc from a dilute solution of zinc in gallium. However, no details were recited as to the specific diffusion parameters or to the zinc concentration and distribution in the n and p layers. Since the internal quantum efficiency reported was only 85%—at liquid nitrogen temperatures, i.e., 77° K—the useful external quantum efficiency could not have been more than about 0.2% at room temperature (300° K). Herzog and coworkers found that when zinc from a zinc arsenide source, $ZnAs_2$, is diffused into n-type gallium arsenide two junctions resulted, i.e., a fast or deeper diffusion front which is a true p-n junction and a slower, shallow diffusion front which is a $p^+$-p junction. Luminescence occurred in the narrow band between these two junctions and the external quantum efficiencies (about 0.2%) were sufficiently high for use in commercial electroluminescent diodes, e.g., photon-coupled amplifiers.

In spite of the extensive research which has been expended on injection-luminescent diodes and the many semi-conductor materials, including GaAs which have been investigated for use in these devices, it does not appear that any commercially practicable injection-luminescent diodes having external quantum efficiencies higher than the 0.1% to 0.3% efficiencies produced in GaAs injection-luminescent devices, as mentioned above, have been developed.

It is therefore, an object of this invention to provide injection-luminescent GaAs diodes having internal quantum emission efficiencies approximating 100% and external quantum emission efficiencies on the order of 1.0%. These electroluminescent GaAs diodes have external quantum efficiencies which are on the order of 100% and more higher efficiencies than those commercially available —a five—to sixfold improvement.

It is a particular object of this invention to provide new semiconductor components from single crystal GaAs characterized as having a region of n-type conductivity doped to a carrier concentration of from $10^{16}$ to $5\times10^{18}$ atoms/cc. of donor impurity atoms, a graded p-n junction and a region of p-type conductivity in which a radiative recombination band of zinc-doped GaAs extends contiguously with and from said p-n junction to a distance of from 5 to about 25 microns and is doped to a carrier concentration of about $4\times10^{19}$ atoms/cc. along the radiative recombination band edge distal to said p-n junction.

A further object of this invention is to provide electroluminescent GaAs diodes which utilize the semiconductor components described in the preceding paragraph.

Still another object of this invention is to provide a controlled vapor diffusion process wherein zinc is diffused into a body of n-type GaAs to provide a region of p-type conductivity GaAs and a substantially linearly graded p-n junction, (as measured by capacitance-voltage measurements) contiguous with a radiative recombination band which is of from 5 to about 25 microns high while maintaining a carrier concentration of zinc atoms at about $4\times10^{19}$ atoms/cc. along the distal edge of said band from said p-n junction.

These and other objects will become apparent as the description of the invention proceeds.

It has now been discovered that when a body of n-type GaAs doped to a carrier concentration of from about $10_{16}$ to $5\times10_{18}$ atoms/cc. is subjected to a controlled vapor diffusion with zinc in such manner that the zinc concentration is maintained at a carrier concentration of about $4\times10^{19}$ atoms/cc. along a diffusion front of from 5 to about 25 microns above the resulting p-n junction, there is produced an extremely efficient radiative recombination band in the p-type conductivity region which merges with the substantially linearly graded p-n junction. Maximum external quantum efficiencies result when this radiative recombination band is about 15 microns in height, hence the preferred height is from about 8 to 17 microns.

In the preferred embodiment of this invention, a wafer of single crystal n-type GaAs doped to a carrier concentration of from $10^{16}$ to $5\times10^{18}$ atoms/cc. with tin is subjected to a controlled vapor diffusion with a zinc-gallium alloy under such conditions of time and temperature that the surface concentration of zinc atoms is maintained at about $4\times10^{19}$ atoms/cc. and the p-n junction depth is from 5 to about 25 microns below the surface of the wafer in the p-type layer formed. In this embodiment, the p-n junction is substantially linearly graded and merges with a highly efficient radiative recombination band or layer in the p-type conductivity region which is defined by the junction depth. This embodiment is more particularly described in Example 1 below.

Figure 1:
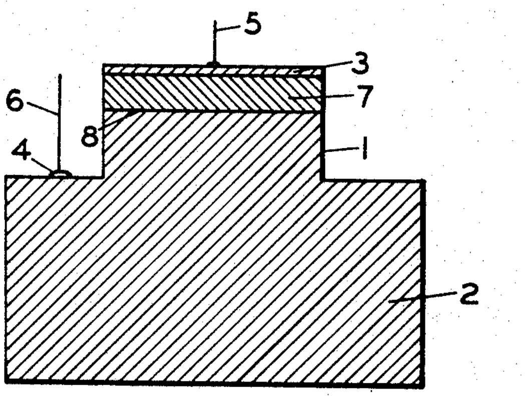
FIGURE 1 is a schematic drawing of a preferred embodiment of the invention wherein the entire p-type layer of the injection-luminescent diode is a radiative recombination band.
Figure 2:
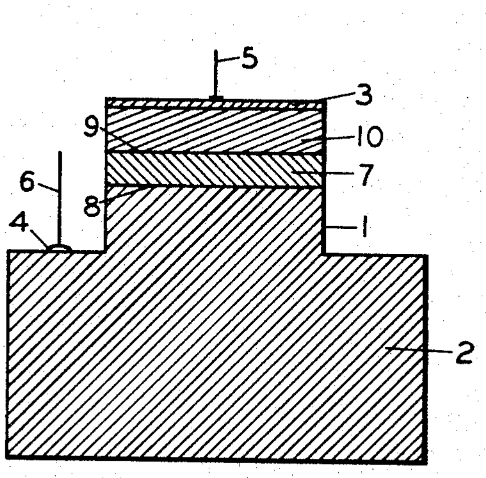
FIGURE 2 is a schematic drawing of an embodiment of the invention wherein an injection-luminescent radiative recombination band having an upper $p^+$-p junction and a lower p-n junction is formed internally of the p-type layer.

In another embodiment of this invention the zinc diffusion is carried out with zinc arsenside as the diffusant. In this diffusion the surface (or limiting) concentration of zinc atoms is on the order of $10^{20}$ atoms/cc., and results in the production of two junctions. The fast diffusion front is initially a true non-graded p-n junction and the slower front is a $p^+$-p junction due to relatively sharp change in zinc concentration between the $p^+$-type region and the p-type region (10 and 7, respectively, in FIG. 2). In this embodiment, it is necessary to adjust the diffusion conditions of time and temperature in such manner that the zinc concentration at the $p^+$-p junction is maintained at about $4\times10^{19}$ atoms/cc. and the distance between the $p^+$-p and p-n junctions is maintained at from 5 to about 25 microns. Under these conditions the p-n junction becomes graded. Example 2 below more fully illustrates this embodiment.

Example 1

This example illustrates the preferred embodiment of this invention for the production of injection-luminescent GaAs diodes wherein the diffusant is a zinc-gallium alloy.

An etch-polished wafer of GaAs, doped with tin to a carrier concentration of $1.7\times10^{18}$ atoms/cc., was diffused at 850° C. for 14.5 hrs. in a 10 ml. evacuated quartz ampoule containing 97 mg. of gallium and 3 mg. of zinc. Under these conditions the surface zinc concentration was maintained at about $4\times10^{19}$ atoms/cc. during the diffusion.

The zinc-diffused GaAs was then cleaved on a <110> 90° cleavage plane and etched with $HF:HNO_3:H_2O$ (1:3:4) solution for 10 seconds to develop the diffusion junction. This junction was 11.7 microns deep and shown by capacity-voltage measurements to be a substantially linearly graded p-n junction.

Diode mesas having an area of $11.25\times10^{-4}$ cm.$^2$ and a height of 29 microns were etched on the (111)B face and the (111)A face lapped and polished to a thickness of 173 microns. An evaporated gold-zinc film 3 was alloyed to the p-type mesa top and a gold-tin-antimony contact 4 alloyed to the n-type base of the mesa. Electrical leads 5 and 6 were attached to contacts 3 and 4, respectively, and a 20 ma. D.C. current was passed through the diode with the n-type side of the diode placed on the face of a solar cell (not shown) enclosed in a light proof box. The external quantum efficiency was measured as solar cell current×100/diode current and in this example: 0.1296×100/20=0.648%. When this measured efficiency is corrected by a standard solar cell efficiency factor of 0.7 the absolute external quantum efficiency is found to be 0.925% (0.648÷0.7).

The diode produced in this example had the following physical and electrical properties:

| | |
|---|---|
| Junction depth | 11.7 microns. |
| Capacity | $7.2\times10^{-8}$ F./cm.$^2$. |
| Voltage breakdown | 8.6 volts (sharp). |
| Built-in voltage | 1.03 volts. |
| Junction characteristic | 3.16. |

The junction characteristic ($n$) is determined from capacitance-voltage measurements. The efficiency of a diode is a direct function of the junction characteristic. Experimental data indicates that the efficiency increases when going from an abrupt junction ($n$=2) to a linear graded junction ($n$=3).

In accordance with the diffusion process of this embodiment zinc-gallium alloys containing less than about 10% zinc are suitable. Diffusion times may range from about 3 hours at the higher levels of said zinc concentrations to about 21 hours for lower zinc concentration levels when conducted at about 850° C. Of course, at higher temperatures diffusion times will be reduced. In general, it is preferred that diffusion temperatures be within the range of from 750° C. to 950° C. and still more preferably between about 825° C. to 875° C.

In this example the entire layer of p-type conductivity GaAs 7 is the radiative recombination band the height of which is measured by the depth of the p-n junction 8 from the surface of the p layer. This will be the case in all modifications of this particular embodiment so long as the limiting zinc concentration is maintained at about $4\times10^{19}$ atoms/cc. and the junction depth is from 5 to about 25 microns. The significance and criticality of the junction depth (i.e., radiative recombination band height) limitation is that when the junction depth increases beyond the specified limit the recombination lifetime near the p-n junction increases and thereby reduces the electroluminescent efficiency. On the other hand, when the p-n junction depth is less than 5 microns from the depth of the p surface, the radiative recombination band becomes too shallow to accommodate the necessary quantum of injected carrier recombinations to produce practical emission efficiencies.

Example 2

This example illustrates an embodiment of the invention wherein a highly efficient radiative recombination band is formed internally of the p-type conductivity layer of a body GaAs having a p-n junction.

The apparatus and procedure set forth in the preceding example is followed except for the diffusion process. Here, a wafer of n-type GaAs doped to a carrier concentration of about $10^{18}$ atoms/cc. is diffused with about 6 mg. of zinc arsenide at a temperature of approximately 1000° C. for about five minutes.

After the diffusion operation two distinct junctions are observed. The lower p-n junction 8 is about 40 microns below the p surface and the upper $p^+$-p junction 9 about 35 microns below the p surface. The resulting radiative recombination band 7 is 5 microns high and the upper edge at the $p^+$-p junction is doped to a zinc concentration of about $4\times10^{19}$ atoms/cc. The external efficiency of this diode is about 0.6%. Efficiencies can be further increased by adjusting the diffusion conditions to increase the height of the radiative recombination band, i.e., the distance between the $p^+$-p and p-n junctions.

As mentioned above, the injection-luminescent gallium arsenide diodes of the present invention must contain an impurity concentration of from $10^{16}$ to $5\times10^{18}$ carriers/cc. in the n-type region of the gallium arsenide. In the above examples, tin was illustrated as a preferred n-type donor. Other n-type donors satisfactorily used herein include sulfur, selenium, tellurium, carbon, silicon, germanium and combinations thereof. Of course, diffusion conditions and quantum efficiencies will vary somewhat depending upon the donor used. In like manner while the invention has been illustrated by the use of zinc arsenide and zinc-gallium alloys it is within the purview of this invention that other sources of zinc may be used at diffusion temperatures, times and zinc concentrations corresponding to the above specified zinc concentration limitations. It is also contemplated that other p-type dopants such as magnesium and cadmium may be used in place of zinc herein.

Injection-luminescent diodes fabricated from the single crystal GaAs semiconductor components produced herein have internal quantum emission efficiencies of approximately 100% and measured external quantum efficiencies on the order of 1.0% when operated at room temperature and at a current density of 20 A./cm.$^2$. It is well known of course that in general external efficiencies can be improved still further by operating at higher current densities and by use of antireflex coatings or geometrical devices such as hemispherical spheres or Weierstrasse lens.

Variations and modifications of the instant invention will occur to those skilled in the art without departing from the spirit and scope thereof.

What is claimed is:

1. As an article of manufacture an injection-luminescent diode comprising a body of single crystal gallium arsenide having a region of n-type conductivity doped to a carrier concentration of from $10^{16}$ to $5\times10^{18}$ atoms/cc. of n-type impurity atoms, a substantially linear graded p-n junction merging with a radiative recombination band which extends from 5 to 25 microns into a region of p-type conductivity and is doped with zinc to a carrier concentration of about $4\times10^{19}$ atoms/cc. along the distal edge from said p-n junction and electrical leads attached to said n- and p-type conductivity regions.

2. As an article of manufacture an injection-luminescent diode comprising a body of single crystal gallium arsenide having a region of n-type conductivity doped to a carrier concentration of from $10^{16}$ to $5\times10^{18}$ atoms/cc. of n-type impurity atoms, a graded p-n junction merging with a radiative recombination band which extends from 5 to 25 microns into a region of p-type conductivity wherein the distal edge of said band from said p-n junction is doped to a carrier concentration of about $4\times10^{19}$ atoms/cc. of zinc and forms a $p^+$-p junction with a $p^+$-type region having a surface concentration of about $10^{20}$ atoms/cc. of zinc and electrical leads attached to said n- and $p^+$-type regions.

References Cited

UNITED STATES PATENTS 3,341,937 6/1967 Dill ------------------ 29—583

JAMES W. LAWRENCE, *Primary Examiner.*

C. R. CAMPBELL, *Assistant Examiner.*

U.S. Cl. X.R.

29—583; 317—234